(12) United States Patent
Schindler et al.

(10) Patent No.: US 11,422,144 B2
(45) Date of Patent: Aug. 23, 2022

(54) MAGNETIC-FIELD SENSOR PACKAGE WITH INTEGRATED PASSIVE COMPONENT

(71) Applicant: Infineon Technologies AG, Neubiberg (DE)

(72) Inventors: Manfred Schindler, Regensburg (DE);
Horst Theuss, Wenzenbach (DE);
Michael Weber, Mainburg (DE)

(73) Assignee: Infineon Technologies AG, Neubiberg (DE)

( * ) Notice: Subject to any disclaimer, the term of this patent is extended or adjusted under 35 U.S.C. 154(b) by 72 days.

(21) Appl. No.: 16/841,870

(22) Filed: Apr. 7, 2020

(65) Prior Publication Data

US 2020/0341023 A1    Oct. 29, 2020

(30) Foreign Application Priority Data

Apr. 24, 2019    (DE) .......................... 102019110570.6

(51) Int. Cl.
*G01P 3/44*    (2006.01)
*H01L 25/16*    (2006.01)
(Continued)

(52) U.S. Cl.
CPC ................ *G01P 3/44* (2013.01); *G01D 5/142* (2013.01); *G01D 5/16* (2013.01); *H01L 23/3121* (2013.01); *H01L 23/3135* (2013.01); *H01L 23/62* (2013.01); *H01L 25/16* (2013.01); *H01L 28/40* (2013.01); *H01L 24/48* (2013.01); *H01L 2224/48106* (2013.01); *H01L 2224/48137* (2013.01); *H01L 2224/48245* (2013.01)

(58) Field of Classification Search
CPC .......... G01P 3/44; G01P 3/488; G01D 5/142; G01D 5/16; G01D 5/147; G01D 5/2216; G01D 5/24438; H01L 23/3121; H01L 23/3135; H01L 23/62; H01L 25/16; H01L 28/40; H01L 43/02; H01L 43/08; H01L 43/065; H01L 43/12; G01R 15/202; G01R 15/207; G01R 19/0092; G01R 15/205; G01R 33/07; G01R 33/0047; G01R 33/09; G01R 33/06; H02M 1/0009; H02M 7/48; G01B 7/146
USPC .... 324/207.2, 207.13, 27.21, 251, 260, 252; 174/558; 702/65
See application file for complete search history.

(56) References Cited

U.S. PATENT DOCUMENTS 9,958,292 B1 *    5/2018    Offermann ........... G01D 11/245
2007/0145972 A1 *    6/2007    Auburger .............. G01P 15/105
                                                              324/252

(Continued)

FOREIGN PATENT DOCUMENTS

DE    10 2004 010 126 A1    9/2004
DE    10 2014 113313 A1    3/2015
JP            7-66356 A    3/1995

*Primary Examiner* — Mouloucoulaye Inoussa
(74) *Attorney, Agent, or Firm* — Harrity & Harrity, LLP

(57) ABSTRACT

A magnetic field sensor package comprises a chip carrier, a magnetic field sensor which is arranged on the chip carrier and designed to detect a magnetic field, an integrated circuit which is arranged on the chip carrier and designed to logically process sensor signals provided by the magnetic field sensor, and at least one integrated passive component which is electrically coupled to at least one of the magnetic field sensor or the integrated circuit.

20 Claims, 3 Drawing Sheets

(51) Int. Cl.
*H01L 23/62* (2006.01)
*H01L 49/02* (2006.01)
*H01L 23/31* (2006.01)
*G01D 5/14* (2006.01)
*G01D 5/16* (2006.01)
*H01L 23/00* (2006.01)

(56) References Cited

U.S. PATENT DOCUMENTS

| | | |
|---|---|---|
| 2007/0176626 A1* | 8/2007 | Bayerer .................. H01L 24/34 257/E23.08 |
| 2008/0013298 A1 | 1/2008 | Sharma et al. |
| 2009/0315547 A1* | 12/2009 | Abwa .................... G01R 33/02 324/244 |
| 2010/0019332 A1 | 1/2010 | Taylor et al. |
| 2013/0249027 A1 | 9/2013 | Taylor et al. |
| 2014/0320124 A1 | 10/2014 | David et al. |
| 2015/0022198 A1 | 1/2015 | David et al. |
| 2015/0285874 A1 | 10/2015 | Taylor et al. |
| 2018/0061784 A1* | 3/2018 | Lamar ................ H01L 25/0652 |

\* cited by examiner

US 11,422,144 B2

MAGNETIC-FIELD SENSOR PACKAGE WITH INTEGRATED PASSIVE COMPONENT

CROSS REFERENCE TO RELATED APPLICATION

This application claims priority to German Patent Application No. 102019110570.6 filed on Apr. 24, 2019, the content of which is incorporated by reference herein in its entirety.

TECHNICAL FIELD

The present disclosure relates, in general, to sensor devices. For example, the disclosure relates to magnetic field sensor packages with integrated passive components.

BACKGROUND

Magnetic field sensors can be used, for example, for speed, position or angle detection. Typical applications for such sensors can be found, in particular, in the automotive sector. The magnetic field sensors can have a sensor cell for detecting magnetic fields and can be connected to a circuit for the logical processing of detected signals.

BRIEF SUMMARY

Different aspects relate to a magnetic field sensor package comprising a chip carrier, a magnetic field sensor which is arranged on the chip carrier and designed to detect a magnetic field, an integrated circuit which is arranged on the chip carrier and designed to logically process sensor signals provided by the magnetic field sensor, and at least one integrated passive component, which is electrically coupled to at least one of the magnetic field sensor or the integrated circuit.

BRIEF DESCRIPTION OF THE DRAWINGS

Magnetic field sensor packages in accordance with the disclosure are described in more detail in the following with the aid of drawings. The elements shown in the drawings are not necessarily reproduced true to scale relative to each other. Identical reference signs can refer to identical components.

DETAILED DESCRIPTION

Figure 1:
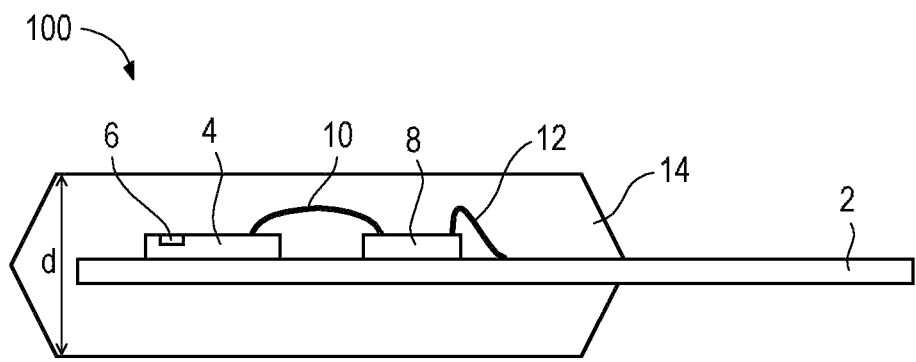
FIG. 1 shows a schematic, cross-sectional side view of a magnetic field sensor package 100 as described in the disclosure.

FIG. 1 shows a schematic, cross-sectional side view of a magnetic field sensor package 100 as described in the disclosure of the implementation. The magnetic field sensor package 100 is shown in a general manner, in order to describe aspects of the disclosure qualitatively. The magnetic field sensor package 100 can have further aspects, which are not shown in FIG. 1 for the sake of simplicity.

The magnetic field sensor package 100 can have a chip carrier 2, which can be a lead frame or a ceramic substrate with optional electrical redistribution layers. The magnetic field sensor package 100 can also include an integrated circuit 4 arranged on the chip carrier 2. In the example of FIG. 1, a magnetic field sensor 6 can be integrated in the integrated circuit 4. Alternatively, the magnetic field sensor 6 can also be a discrete magnetic field sensor, e.g. the magnetic field sensor 6 can be implemented as a discrete component. The magnetic field sensor 6 can be designed to detect a magnetic field and electrical signals based on the detected magnetic field. The integrated circuit 4 can be designed to logically process the sensor signals provided by the magnetic field sensor 6. The integrated circuit 4 can contain, for example, an application-specific integrated circuit (ASIC). If the magnetic field sensor 6 is contained in the integrated circuit 4, the integrated circuit 4 can also be referred to as an ASIC sensor.

The magnetic field sensor package 100 can also comprise at least one integrated passive component, which is electrically coupled to at least one of the magnetic field sensor 6 or the integrated circuit 4. In the example of FIG. 1, the at least one integrated passive component can be integrated into a semiconductor chip 8 arranged on the chip carrier 2. The semiconductor chip 8 and the integrated circuit 4 can be electrically connected to each other. In addition, the semiconductor chip 8 can be electrically connected to the chip carrier 2. In the example of FIG. 1, such electrical connections may be realized by one or more bond wires 10 and 12. A detailed example representation of such electrical connections is shown and discussed in FIG. 4.

The magnetic field sensor package 100 can also have an encapsulation material 14, which at least partially encapsulates the integrated circuit 4 and the semiconductor chip 8. The encapsulation material can be fabricated, for example, from a laminate, an epoxy resin, a thermoplastic or a thermosetting polymer. An electrical contacting to the integrated circuit 4 and the semiconductor chip 8 from outside of the encapsulation material 14 can be provided using the chip carrier 2. In the example of FIG. 1, such an electrical contact can be provided by one or more connection leads of a lead frame. An example design of such a lead frame is shown and discussed in FIG. 4.

In one example, the magnetic field sensor 6 can be a Hall-effect magnetic field sensor. In other examples, the magnetic field sensor 6 can be an xMR sensor, in particular an AMR sensor, a GMR sensor, or a TMR sensor. For example, in the case of a Hall sensor, a Hall element or a Hall sensor cell can be integrated in the integrated circuit 4. In such a Hall-IC a signal amplification, an analog-to-digital conversion, a digital signal processing, and/or an offset and temperature compensation can be carried out.

The passive component integrated in the semiconductor chip 8 can have at least one capacitor. Such an integrated capacitor can be, for example, a "SilCap" (for "silicon capacitor"). The at least one capacitor can be designed for one or more of the following functions. In one example, the capacitor can provide a supply voltage for the magnetic field sensor package 100, in particular if an actual supply voltage of the magnetic field sensor package 100 temporarily fails. The capacitor can therefore provide the function of a buffer capacitor in order to bypass or backup a supply voltage of the magnetic field sensor package 100. In another example, the capacitor can provide an ESD (Electro-Static Discharge) protection for the magnetic field sensor package 100. For this purpose, the capacitor can be designed to protect the magnetic field sensor package 100 against voltage flashovers which can be caused, for example, by operating voltage spikes or lightning strikes. In another example, the capacitor can provide electromagnetic compatibility (EMC) of the magnetic field sensor package 100 which should be present, for example, when the magnetic field sensor package 100 is mounted on a printed circuit board. In particular, the capacitor can provide a signal smoothing and prevent escalating resonances.

The at least one capacitor can have a capacitance of greater than approximately 22 nF. In particular, the capacitance can have values of up to approximately 500 nF. In integrating the capacitor into the semiconductor material of the semiconductor chip 8 the capacitance value of the capacitor can be selected and adjusted relatively accurately from a continuous range. In contrast, for example, SMD (Surface Mount Device) capacitors only provide selected, discrete capacitance values.

The magnetic field sensor package 100 does not need to be limited to a single integrated component, but can include at least one other integrated passive component, which, for example, can be integrated into the semiconductor chip 8. The multiple passive components can be easily integrated into the semiconductor material. In one example, the semiconductor chip 8 can have a plurality of capacitors. In other examples, the semiconductor chip 8 can have at least one of a resistor, an inductor, or a diode. The integration of a plurality of passive integrated components into the same semiconductor chip 8 allows a dimension of the magnetic field sensor package 100 to be reduced in comparison to a magnetic field sensor package in which the passive components are implemented by SMD devices.

Because the integrated circuit 4, the magnetic field sensor 6 and the integrated passive component can all be integrated in one semiconductor material, the possibility exists to distribute these components or their functionalities over one or more semiconductor chips flexibly and in any given manner. In the example of FIG. 1 the integrated circuit 4 and the magnetic field sensor 6 are integrated together in a second semiconductor chip which is separate from the first semiconductor chip 8. As an alternative to the example of FIG. 1, the following additional configurations may obtain, for example. In a first example, the integrated circuit 4 and the integrated passive component can be integrated jointly in the first semiconductor chip 8. In a second example, the magnetic field sensor 6 and the integrated passive component can be integrated jointly in the first semiconductor chip 8, while the integrated circuit 4 can be integrated in a second semiconductor chip separate from the first semiconductor chip 8. In a third example, the magnetic field sensor 6, the integrated circuit 4 and the integrated passive component can be integrated jointly in the first semiconductor chip 8. In such a case, the integrated passive component can have, in particular, a capacitor with a capacitance of more than 1 nF or more than 2 nF or more than 3 nF or more than 4 nF, in order to provide EMC functionality, for example.

The integrated circuit 4 and the semiconductor chip 8 can be mounted on the chip carrier 2 using the same assembly technology. This allows the application of further mounting techniques to be prevented so that further costs can be avoided. In one example, both components can be mounted on the chip carrier 2 using an adhesive, wherein the adhesive can be, in particular, electrically insulating. In contrast to this, mounting of passive SMD components would necessitate a soldering process or the application of a conductive adhesive. Such a conductive adhesive can be, for example, a silver conductive adhesive, which may be susceptible to electrochemical migration processes that may lead to unwanted short circuits. Such electrochemical migration processes can thus be avoided in magnetic field sensor packages in accordance with the implementation.

The integrated circuit 4 and the semiconductor chip 8 can be electrically contacted in the same way. In the example of FIG. 1 the electrical contacts on the upper sides of the integrated circuit 4 and the semiconductor chip 8 can be contacted via the bond wires 10 and 12. As already mentioned above, in contrast to this the use of passive SMD components use at least one additional process for the electrical contacting of the SMD components. The areas for the electrical contacting of the chip carrier 2, according to the disclosure, can thus have a composition designed for contacting using a wire bonding process, but not necessarily for contacting using a soldering process. The complexity of the surface structure of the chip carrier 2 can therefore be reduced when using a magnetic field sensor package in accordance with the implementation.

In the example of FIG. 1 the integrated circuit 4 and the first semiconductor chip 8 are both encapsulated in the same encapsulation material 14. Alternatively, the magnetic field sensor package can have more than one encapsulation material. For example, the integrated circuit 4 can be encapsulated in a first encapsulation material, and the semiconductor chip 8 can be encapsulated in a second encapsulation material, separate from the first encapsulation material. The first and the second encapsulation material can be produced, in particular, from the same material.

The use of integrated passive components means that the size of the magnetic field sensor package 100 can be reduced. In particular, a dimension "d" of the magnetic field sensor package 100 or the encapsulation material 14 in a direction perpendicular to the chip carrier 2 can be less than approximately 1.2 mm. In a specific example, the dimension "d" can have a value of approximately 1.1 mm. In comparison to this, an analogous dimension of a conventional magnetic field sensor package with passive SMD components can have a value significantly greater than 1.2 mm, due to the size of the SMD components. In a specific example, the same dimension of a conventional magnetic field sensor package can have a value of approximately 1.56 mm. The use of integrated passive components in accordance with the implementation in such a case can reduce the dimension "d" to a value of approximately 460 microns.

The semiconductor chip 8 or the passive component integrated therein can be designed to operate at a temperature of approximately 160° C. In comparison to this, magnetic field sensor packages with SMD devices, such as ceramic capacitors, can only be used at operating temperatures up to approximately 150° C. In certain applications, when using the magnetic field sensor package 100 an additional cooling may not be used. For example, in the vicinity of the brakes of a heavy goods vehicle, temperatures of up to 200° C. can occur. When magnetic field sensor packages with SMD devices are used, cooling must be provided to reduce the temperature to below 150° C. In contrast, when a magnetic field sensor package in accordance with the implementation is used, such a cooling can be dispensed with.

The magnetic field sensor package 100 may be, in particular, free of passive SMD components. In conventional magnetic field sensor packages, a majority of the passive components can be realized by SMD components. In contrast, in the case of a magnetic field sensor package according to the implementation, the functionality of these SMD components can be combined in the semiconductor chip 8.

Figure 2A:
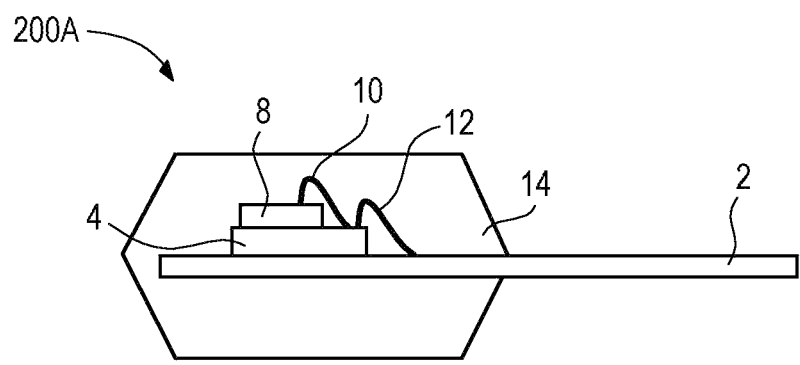
FIG. 2A shows a schematic, cross-sectional side view of a magnetic field sensor package 200A as described in the disclosure of the implementation.

FIG. 2A shows a schematic, cross-sectional side view of a magnetic field sensor package 200A as described in the disclosure of the implementation. The magnetic field sensor package 200A can be at least partially similar to the magnetic field sensor package 100 of FIG. 1, so that comments in relation to FIG. 1 can also apply to FIG. 2A.

In contrast to FIG. 1, in FIG. 2A the integrated circuit 4 and the semiconductor chip 8 are stacked on top of one another on the same mounting surface of the chip carrier 2. The magnetic field sensor 6 from FIG. 1 is not explicitly shown for the sake of simplicity. In the example of FIG. 2A an electrical connection between the integrated circuit 4, the semiconductor chip 8 and the chip carrier 2 is provided via one or more bond wires 10 and 12.

Figure 2B:
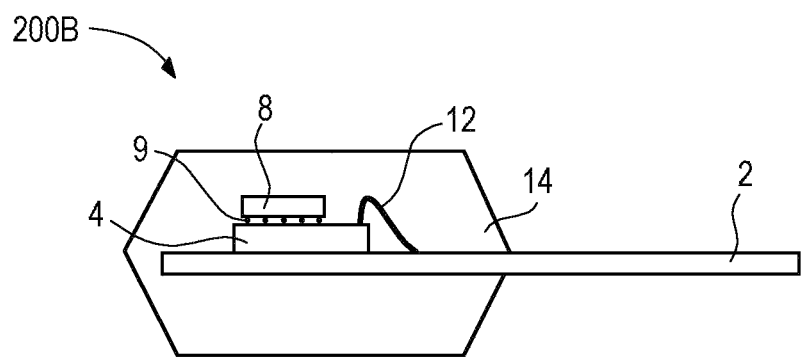
FIG. 2B shows a schematic, cross-sectional side view of a magnetic field sensor package 200B as described in the disclosure of the implementation.

As an alternative to the example shown in FIG. 2A, the semiconductor chip 8 can be a flip-chip arranged on the integrated circuit 4. An example magnetic field sensor package 200B in accordance with the implementation is shown schematically in the cross-sectional side view of FIG. 2B. An electrical connection between the semiconductor chip 8 and the integrated circuit 4 can be provided using solder deposits or solder balls 9 on the underside of the semiconductor chip 8. The integrated circuit 4 arranged under the semiconductor chip 8 can be electrically connected to the chip carrier 2 via one or more bond wires 12.

Figure 2C:
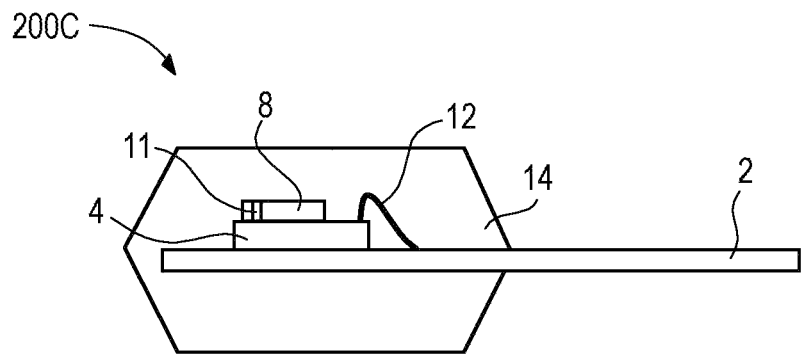
FIG. 2C shows a schematic, cross-sectional side view of a magnetic field sensor package 200C as described in the disclosure of the implementation.

FIG. 2C shows a schematic, cross-sectional side view of a magnetic field sensor package 200C as described in the disclosure of the implementation. The magnetic field sensor package 200C can be at least partially similar to the magnetic field sensor package 200A of FIG. 2A. In contrast to FIG. 2A, the semiconductor chip 8 in the example of FIG. 2C can be electrically connected to the integrated circuit 4 using a via 11, for example by one or more "through-silicon vias" (TSV). By the use of the via 11 instead of the bond wire 10 (see FIG. 2A), an air gap between the magnetic field sensor package 200C and a transmitter element (see FIGS. 5 and 6) can be reduced in size. At the same time, the effect of the inductance of the bond wire 10 can be avoided.

Figure 3:
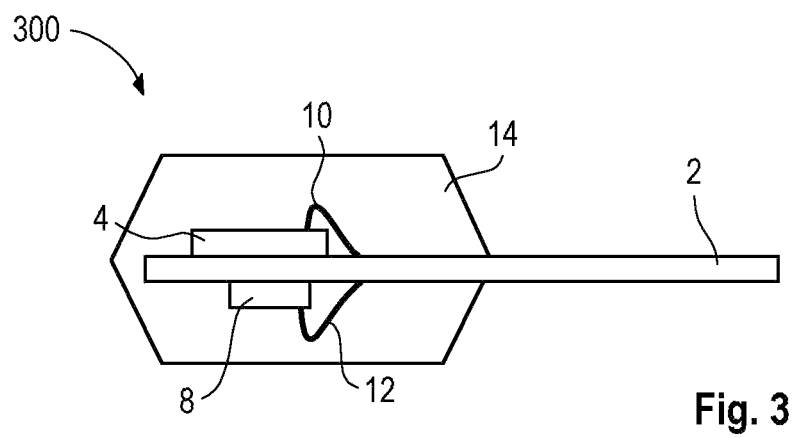
FIG. 3 shows a schematic, cross-sectional side view of a magnetic field sensor package 300 as described in the disclosure of the implementation.

FIG. 3 shows a schematic, cross-sectional side view of a magnetic field sensor package 300 as described in the disclosure of the implementation. The magnetic field sensor package 300 can be at least partially similar to the magnetic field sensor package 100 of FIG. 1, so that comments in relation to FIG. 1 can also apply to FIG. 3.

In contrast to FIG. 1, in FIG. 3 the integrated circuit 4 and the first semiconductor chip 8 are arranged on opposite mounting surfaces of the chip carrier 2. The magnetic field sensor 6 from FIG. 1 is not explicitly shown for the sake of simplicity. An electrical connection between the integrated circuit 4 and the semiconductor chip 8 can be provided via, for example, the chip carrier 2. For example, the chip carrier can be a ceramic substrate with an electrical redistribution layer action, using which such an electrical connection can be implemented.

Figure 4:
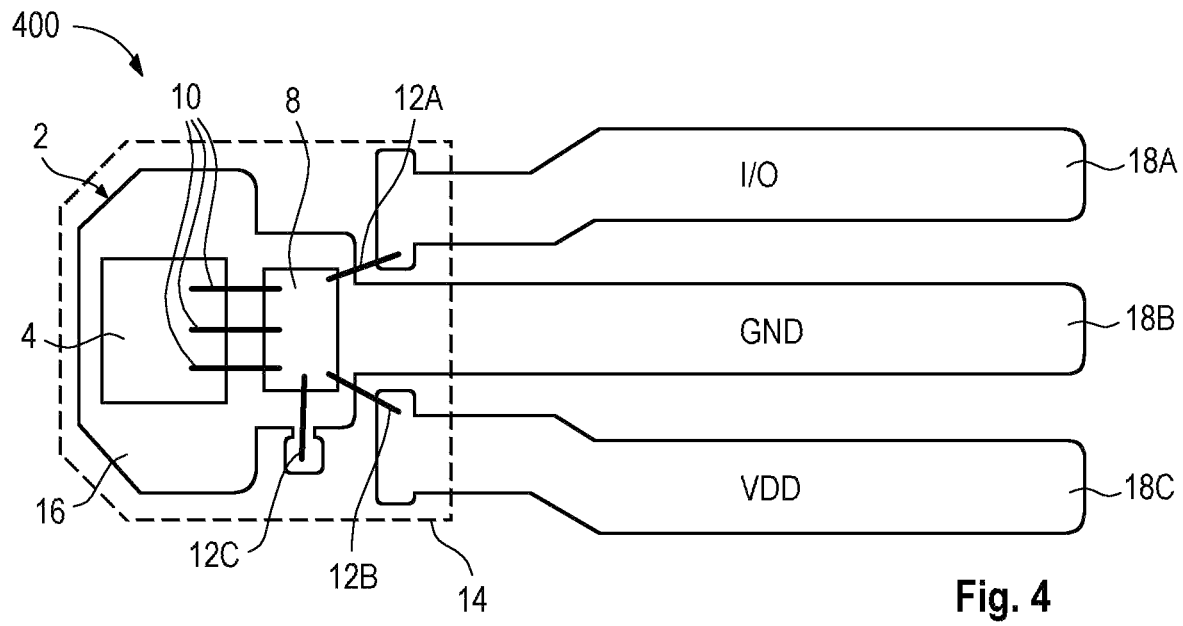
FIG. 4 shows a schematic plan view of a magnetic field sensor package 400 as described in the disclosure of the implementation.

FIG. 4 shows a schematic plan view of a magnetic field sensor package 400 as described in the disclosure of the implementation. The magnetic field sensor package 400 can at least partially resemble or correspond to the magnetic field sensor package 100 of FIG. 1, so that comments in relation to FIG. 1 can also apply to FIG. 4.

The magnetic field sensor package 400 includes an integrated circuit 4 and a semiconductor chip 8 with at least one integrated passive component, which are arranged on a chip carrier 2. The magnetic field sensor 6 from FIG. 1 is not explicitly shown for the sake of simplicity. In the example of FIG. 4, the chip carrier 2 can be implemented in the form of a lead frame, which can be formed, for example, from copper, nickel, aluminum, or stainless steel. The lead frame can have a diepad 16 and, for example, three connecting leads 18A, 18B and 18C. The diepad 16 and the middle connection lead 18B can be formed as a single piece. The upper connection lead 18A can be an input/output contact (see "I/O"). The middle connection lead 18B can be connected to a ground potential (see "GND"). The lower connection lead 18C can provide a supply voltage (see "VDD"). The arrangement shown in FIG. 4 of the connection leads 18A, 18B and 18C relative to each other is an example.

The integrated circuit 4 can be electrically connected to the semiconductor chip 8 via bond wires 10. The semiconductor chip 8 can be electrically connected to the I/O connection lead 18A via a first bond wire 12A. In addition, the semiconductor chip 8 can be connected to the supply voltage via a second bond wire 12B and via the connection lead 18C. Furthermore, the semiconductor chip 8 can be connected via a third bond wire 12C to the diepad 16, e.g. grounded. In the example of FIG. 4 the integrated circuit 4 and the semiconductor chip 8 are embedded in an encapsulation material 14. An electrical contacting of the embedded components from outside of the encapsulation material 14 can be carried out via the connection leads 18A-18B.

The integrated circuit 4 and the semiconductor chip 8 can be arranged on the diepad 16, e.g. on the same mounting surface of the chip carrier 2. The integrated circuit 4 and the first semiconductor chip 8 can then be at an equal potential (see "GND"). In conventional magnetic field sensor packages, passive SMD components which are designed to provide, for example, EMC or ESD functionality are often arranged in such a way that they bridge gaps or openings that are formed between different connection leads of the lead frame. If a plurality of such passive SMD components are to be arranged, the options for arrangement of the integrated circuit are severely restricted on account of the complex chip carrier structure used for proper operation. In contrast, the passive components of a magnetic field sensor package in accordance with the implementation can be integrated into one or more semiconductor chips 8 which can be arranged with the integrated circuit 4 on a common surface of the chip carrier 2 at an equal potential. In a magnetic field sensor package in accordance with the implementation, therefore, it is not necessary to form gaps or openings in the chip carrier 2 for the arrangement of passive SMD components. Instead, chip carriers with a less complex geometric structure can be used.

Figure 5:
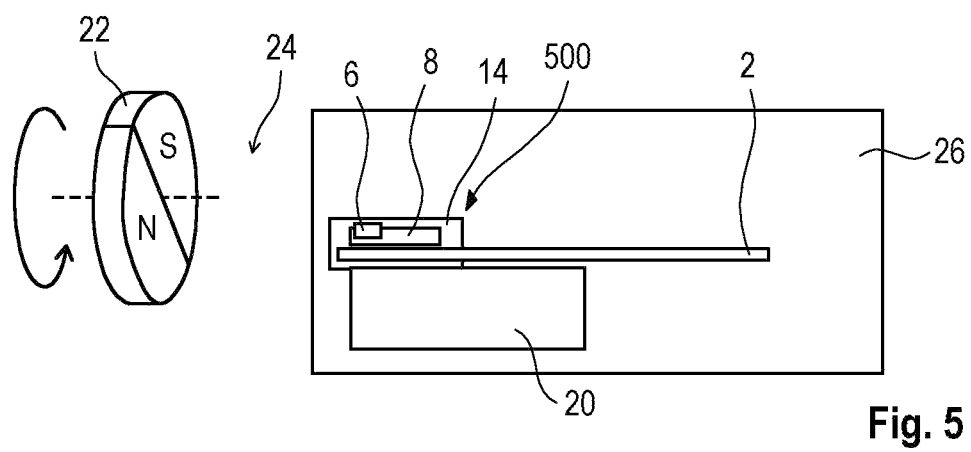
FIG. 5 shows a schematic, perspective view of a magnetic field sensor package 500 as described in the disclosure of the implementation. The magnetic field sensor package 500 is arranged on a back-bias magnet relative to a ferromagnetic wheel in a top-read configuration.

FIG. 5 shows a schematic, perspective view of a magnetic field sensor package 500 as described in the disclosure of the implementation. The magnetic field sensor package 500 can be similar, for example, to one of the magnetic field sensor packages of FIGS. 1 to 4. In FIG. 5, for the sake of simplicity, only one semiconductor chip 8 of the magnetic field sensor package 500 is shown. In one example, a magnetic field sensor 6, a circuit for processing electrical signals from the magnetic field sensor 6, and at least one passive component can be integrated in the semiconductor chip 8. In other examples, the magnetic field sensor package 500 can have a plurality of semiconductor chips, over which the functionalities of the identified components can be distributed in different configurations, as has already been discussed in connection with FIG. 1.

The magnetic field sensor package 500 can be positioned on a back-bias magnet 20 and relative to a ferromagnetic wheel 22. The magnetic field sensor package 500 and the ferromagnetic wheel 22 can be separated from each other by an air gap 24. The magnetic field sensor package 500 and the back-bias magnet 20 can be at least partially embedded in a second encapsulation material 26. The chip carrier 2, or connection leads of the chip carrier 2 can protrude at least partially out of the second encapsulation material 26, so that the electrical components of the magnetic field sensor package 500 can be electrically contacted from outside of the second encapsulation material 26 also. The second encapsulation material 26 can be fabricated, for example, from a laminate, an epoxy resin, a thermoplastic or a thermosetting polymer.

The magnetic field sensor 6 can be designed to detect a speed of the ferromagnetic wheel 22. In the example of FIG. 5, the ferromagnetic wheel 22 has a north and a south pole (see "N" and "S"), as shown in the drawing. In another example, the ferromagnetic wheel 22 can be a ferromagnetic gear wheel. The back-bias magnet 20 can generate a supporting field for the magnetic field sensor 6. Due to the magnetic polarity of the ferromagnetic wheel 22 in FIG. 5 (or due to the irregular shape of a gear wheel in another example), the magnetic field detected by the magnetic field sensor 6 changes during a rotation of ferromagnetic wheel 22 and the magnetic field sensor 6 can generate output pulses. The output pulses can be forwarded to the integrated logic circuit (e.g. an ASIC), which can count the output pulses and calculate the speed of the rotating ferromagnetic wheel 22. The arrangement of FIG. 5 can be used, for example, in automotive applications for the determination of wheel speeds, in particular in safety-relevant applications such as ABS (anti-lock braking system), engines or gearboxes.

Figure 6:
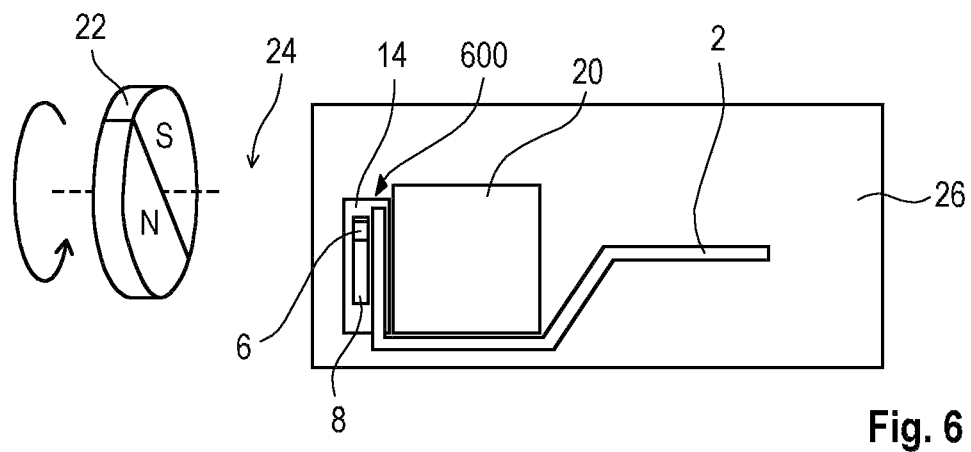
FIG. 6 shows a schematic, perspective view of a magnetic field sensor package 600 as described in the disclosure of the implementation. The magnetic field sensor package 600 is arranged on a back-bias magnet relative to a ferromagnetic wheel in a side-read configuration.

FIG. 6 shows a schematic, perspective view of a magnetic field sensor package 600 as described in the disclosure of the implementation. The magnetic field sensor package 600 can be at least partially similar to the magnetic field sensor package 500 of FIG. 5, so that comments in relation to FIG. 5 can also apply to FIG. 6. In contrast to FIG. 5, the magnetic field sensor package 600 and the back-bias magnet 20 are arranged relative to each other in a different way. In particular, the chip carrier 2 can be bent around the back-bias magnet 20. The relative arrangement of the magnetic field sensor package 500 and the back-bias magnet 20 in FIG. 5 can be referred to as a top-read configuration. The relative arrangement of the magnetic field sensor package 600 and the back-bias magnet 20 in FIG. 6 can be referred to as a side-read configuration.

In the examples of FIGS. 5 and 6, the ferromagnetic wheel 22 functions as a transmitter element. In other examples, other components can have the function of a transmitter element, such as multipole magnets. In this case, for example, configurations without a back-bias magnet but with a magnetic target, such as a multipolar wheel, are conceivable instead.

As already discussed above in connection with FIG. 1, by the use of passive components integrated in a semiconductor chip, in particular, a dimension of the magnetic field sensor package can be reduced in comparison to the use of passive SMD components. For this reason, magnetic field sensor packages according to the implementation can be designed to be arranged relative to a back-bias magnet in both a top-read configuration and in a side-read configuration. As already explained above, in conventional magnetic field sensor packages the use of multiple passive SMD components can severely restrict the arrangement of the integrated circuit owing to the complex chip carrier structure. This can complicate an arrangement of such conventional magnetic field sensor packages in a top-read configuration, and at worst make it impossible.

EXAMPLES

In the following, magnetic field sensor packages are explained on the basis of examples.

Example 1 is a magnetic field sensor package, comprising: a chip carrier; a magnetic field sensor which is arranged on the chip carrier and designed to detect a magnetic field; an integrated circuit which is arranged on the chip carrier and designed to logically process sensor signals provided by the magnetic field sensor; and at least one integrated passive component, which is electrically coupled to at least one of the magnetic field sensor or the integrated circuit.

Example 2 is a magnetic field sensor package according to example 1, further comprising: a first semiconductor chip arranged on the chip carrier, the at least one integrated passive component being integrated into the first semiconductor chip.

Example 3 is a magnetic field sensor package according to example 1 or 2, wherein the integrated passive component comprises at least one capacitor, the at least one capacitor being designed for at least one of the following: to provide a supply voltage of the magnetic field sensor package; to provide ESD protection for the magnetic field sensor package; and to provide electromagnetic compatibility of the magnetic field sensor package.

Example 4 is a magnetic field sensor package according to example 3, the at least one capacitor having a capacitance of greater than 22 nF.

Example 5 is a magnetic field sensor package according to any of the preceding examples, also comprising: at least one other integrated passive component, wherein the at least one other integrated passive component comprises at least one of a resistor, an inductor, a capacitor, or a diode.

Example 6 is a magnetic field sensor package according to any one of the preceding examples, wherein the integrated circuit and the integrated passive component are integrated jointly in a semiconductor chip.

Example 7 is a magnetic field sensor package according to any one of the examples 2 to 5, wherein the magnetic field sensor and the integrated circuit are integrated jointly in a second semiconductor chip which is separate from the first semiconductor chip.

Example 8 is a magnetic field sensor package according to one of the examples 2 to 5, wherein the magnetic field sensor and the integrated passive component are integrated jointly in the first semiconductor chip, and the integrated circuit is integrated in a second semiconductor chip which is separate from the first semiconductor chip.

Example 9 is a magnetic field sensor package according to one of the examples 2 to 5, wherein the magnetic field sensor, the integrated circuit and the integrated passive component are integrated jointly in the first semiconductor chip, wherein the integrated passive component comprises at least one capacitor with a capacitance of more than 1 nF.

Example 10 is a magnetic field sensor package according to one of the examples 2 to 9, wherein the first semiconductor chip and the integrated circuit are arranged on the same mounting surface of the chip carrier.

Example 11 is a magnetic field sensor package according to one of the examples 2 to 9, wherein the first semiconductor chip and the integrated circuit are arranged on opposite mounting surfaces of the chip carrier.

Example 12 is a magnetic field sensor package according to one of the examples 2 to 9, wherein the first semiconductor chip and the integrated circuit are arranged stacked on top of one another on the same mounting surface of the chip carrier.

Example 13 is a magnetic field sensor package according to one of the examples 2 to 12, further comprising: an encapsulation material, wherein the first semiconductor chip and the integrated circuit are both encapsulated in the same encapsulation material.

Example 14 is a magnetic field sensor package according to example 13, wherein a dimension of the encapsulation material in a direction perpendicular to the chip carrier is less than 1.2 mm.

Example 15 is a magnetic field sensor package according to any one of the examples 2 to 12, further comprising: a first encapsulation material, wherein the first semiconductor chip is encapsulated in the first encapsulation material; and a second encapsulation material separate from the first encapsulation material, wherein the integrated circuit is encapsulated in the second encapsulation material.

Example 16 is a magnetic field sensor package according to any one of the preceding examples, wherein the magnetic field sensor package is designed to be arranged relative to a back-bias magnet in both a top-read configuration and in a side-read configuration.

Example 17 is a magnetic field sensor package according to any one of the preceding examples, wherein the magnetic field sensor package is arranged on a back-bias magnet, the magnetic field sensor is positioned relative to a transmitter element, the magnetic field sensor is designed to detect a speed of the transmitter element, and the magnetic field sensor package and the transmitter element are separated by an air gap.

Example 18 is a magnetic field sensor package according to one of the examples 2 to 17, wherein the electrical contacts of the first semiconductor chip and the integrated circuit are contacted via bond wires.

Example 19 is a magnetic field sensor package according to one of the preceding examples, wherein the integrated passive component is designed to operate at a temperature of over 160° C.

Example 20 is a magnetic field sensor package according to one of the preceding examples, wherein the magnetic field sensor package is free of passive SMD components.

Although specific implementations have been shown and described herein, it is obvious to the person of average skill in the art that a plurality of alternative and/or equivalent implementations can replace the specific implementations shown and described, without departing from the scope of the present disclosure. This application is intended to include all modifications or variations of the specific implementations discussed herein. It is therefore intended that this disclosure is limited only by the claims and their equivalents.

What is claimed is:

1. A magnetic field sensor package, comprising:
    a chip carrier;
    a magnetic field sensor arranged on the chip carrier,
        the magnetic field sensor configured to detect a magnetic field;
    an integrated circuit arranged on the chip carrier,
        the integrated circuit configured to logically process sensor signals provided by the magnetic field sensor;
    an integrated passive component electrically coupled to at least one of the magnetic field sensor or the integrated circuit;
    a first semiconductor chip arranged on the chip carrier,
        wherein the integrated passive component is integrated into the first semiconductor chip; and
    a second semiconductor chip, which is separate from the first semiconductor chip,
        wherein the magnetic field sensor and the integrated circuit are jointly integrated in the second semiconductor chip, and
        wherein the second semiconductor chip is directly connected to the first semiconductor chip via one or more vias.

2. The magnetic field sensor package as claimed in claim 1, wherein the integrated passive component comprises at least one capacitor, the at least one capacitor being configured for at least one of the following:
    to provide a supply voltage of the magnetic field sensor package;
    to provide Electro-Static Discharge protection for the magnetic field sensor package; or
    to provide electromagnetic compatibility of the magnetic field sensor package.

3. The magnetic field sensor package as claimed in claim 2, wherein the at least one capacitor has a capacitance of greater than 22 nF.

4. The magnetic field sensor package as claimed in claim 1, further comprising:
    at least one other integrated passive component, wherein the at least one other integrated passive component comprises at least one of a resistor, an inductor, a capacitor, or a diode.

5. The magnetic field sensor package as claimed in claim 1, wherein another integrated circuit and the integrated passive component are jointly integrated in a semiconductor chip.

6. The magnetic field sensor package as claimed in claim 1, wherein the magnetic field sensor and another integrated passive component are jointly integrated in the second semiconductor chip.

7. The magnetic field sensor package as claimed in claim 1, wherein the first semiconductor chip and the integrated circuit are arranged on the same mounting surface of the chip carrier.

8. The magnetic field sensor package as claimed in claim 1, wherein the first semiconductor chip and the integrated circuit are arranged on opposite mounting surfaces of the chip carrier.

9. The magnetic field sensor package as claimed in claim 1, wherein the first semiconductor chip and the integrated circuit are arranged stacked on top of one another on a same mounting surface of the chip carrier.

10. The magnetic field sensor package as claimed in claim 1, further comprising:

an encapsulation material, wherein the first semiconductor chip and the integrated circuit are both encapsulated in the same encapsulation material.

11. The magnetic field sensor package as claimed in claim 10, wherein a dimension of the encapsulation material in a direction perpendicular to the chip carrier is less than 1.2 mm.

12. The magnetic field sensor package as claimed in claim 1, further comprising:
a first encapsulation material, wherein the first semiconductor chip is encapsulated in the first encapsulation material; and
a second encapsulation material separate from the first encapsulation material, wherein the integrated circuit is encapsulated in the second encapsulation material.

13. The magnetic field sensor package as claimed in claim 1, wherein the magnetic field sensor package is configured to be arranged relative to a back-bias magnet in both a top-read configuration and in a side-read configuration.

14. The magnetic field sensor package as claimed in claim 1, wherein
the magnetic field sensor package is arranged on a back-bias magnet,
the magnetic field sensor is positioned relative to a transmitter element,
the magnetic field sensor is configured to detect a speed of the transmitter element, and
the magnetic field sensor package and the transmitter element are separated by an air gap.

15. The magnetic field sensor package as claimed in claim 1, wherein electrical contacts of the first semiconductor chip and the integrated circuit are contacted via bond wires.

16. The magnetic field sensor package as claimed in claim 1, wherein the integrated passive component is configured to operate at a temperature of over 160° C.

17. The magnetic field sensor package as claimed in claim 1, wherein the magnetic field sensor package is free of passive Surface Mount Device (SMD) components.

18. The magnetic field sensor package as claimed in claim 1, wherein the first semiconductor chip is communicatively coupled to the second semiconductor chip.

19. The magnetic field sensor package as claimed in claim 1, wherein the second semiconductor chip is arranged on the chip carrier.

20. The magnetic field sensor package as claimed in claim 1, wherein the chip carrier comprises of a composition for wire bonding.

* * * * *